(12) United States Patent
Hashizume et al.

(10) Patent No.: US 6,410,102 B1
(45) Date of Patent: *Jun. 25, 2002

(54) PLASMA PROCESS METHOD

(75) Inventors: Junichiro Hashizume; Shigenori Ueda, both of Nara; Makoto Aoki, Joyo, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/874,584

(22) Filed: Jun. 13, 1997

(30) Foreign Application Priority Data

Jun. 17, 1996 (JP) .............................................. 8-177126

(51) Int. Cl.[7] .............................................. C23C 14/56
(52) U.S. Cl. ........................ 427/534; 427/535; 427/569; 438/710; 438/729; 118/723 E
(58) Field of Search ...................... 118/723 E; 427/577, 427/534, 535, 569; 438/710, 729

(56) References Cited

U.S. PATENT DOCUMENTS

| | | | |
|---|---|---|---|
| 4,265,991 A | | 5/1981 | Hirai et al. .................... 430/64 |
| 5,283,087 A | * | 2/1994 | Yamazaki et al. .......... 427/577 |
| 5,540,781 A | * | 7/1996 | Yamagami et al. ....... 118/723 E |

FOREIGN PATENT DOCUMENTS

| | | |
|---|---|---|
| JP | 59142839 | 8/1984 |
| JP | 60168156 | 8/1985 |
| JP | 60178457 | 9/1985 |
| JP | 61231561 | 10/1986 |
| JP | 60225854 | 11/1987 |
| JP | 364466 | 3/1991 |

OTHER PUBLICATIONS

H. Curtins, et al., "Influence of Plasma Excitation Frequency for a–Si:H Thin Film Deposition", Plasma Chem and Plasma Proc, vol. 7, No. 3, pp. 267–273 (1987).

* cited by examiner

Primary Examiner—Gregory Mills
Assistant Examiner—Rudy Zervigon
(74) Attorney, Agent, or Firm—Fitzpatrick, Cella, Harper & Scinto

(57) ABSTRACT

A plasma process, which can fabricate a deposition film in short time and at low cost, which can fabricate a deposition film with excellent reproducibility, which can greatly decrease the cleaning time upon cleaning, and which is optimum for fabricating a deposit film, especially a photosensitive member for electrophotography, capable of achieving a high charge potential upon electrification and capable of obtaining clear images with less image defects, is arranged such that a raw-material gas comprising silicon is introduced into a deposition chamber while evacuating the deposition chamber capable of being kept airtight in a vacuum, the raw-material gas is decomposed by high-frequency power in the VHF band, film formation is carried out to form a deposit film on a substrate installed in the deposition chamber, and thereafter cleaning inside the deposition chamber is carried out by etching and removing a deposit film depositing inside the deposition chamber, using a gas containing at least fluorine and using high-frequency power of a frequency lower than the VHF band.

4 Claims, 5 Drawing Sheets

PLASMA PROCESS METHOD

BACKGROUND OF THE INVENTION

1. Field of the Invention

The present invention relates to a plasma process method including a plasma CVD (Chemical Vapor Deposition) process capable of well forming crystalline or non-monocrystalline, functional deposit films useful to photosensitive devices for electrophotography, line sensors for capture of image, image pickup devices, photovoltaic devices, etc. as semiconductor devices, a sputtering process capable of suitably forming deposit films of insulating films, metal wires, etc. as semiconductor devices or optic elements, or etching of a body to be processed, or the like and also to an apparatus that can carry out the mentioned plasma process. More particularly, the invention concerns the plasma process method and the plasma process apparatus for processing a substrate, particularly using a plasma as an excitation source and, especially, the invention concerns the plasma process method and the plasma process apparatus that can suitably use high frequencies of 450 MHz and less.

2. Related Background Art

Proposed in the technology of element members used for electrophotographic, photosensitive member are a variety of materials including selenium, cadmium sulfide, zinc oxide, phthalocyanine, amorphous silicon (hereinafter referred to as a-Si), and so on.

Among others, non-monocrystalline deposit films containing silicon as a main ingredient typified by a-Si, for example, amorphous deposit films of a-Si or the like compensated by hydrogen and/or halogen (for example, fluorine, chlorine, or the like), are proposed as high-performance, high-durability, and nonpolluting photosensitive members, some of which are used practically.

U.S. Pat. No. 4,265,991 discloses the technology of the electrophotographic, photosensitive member a photoconductive layer of which is made mainly of a-Si.

The a-Si photosensitive members have high surface hardness, demonstrate high sensitivity also to long-wavelength light such as semiconductor lasers (770 nm to 800 nm), and exhibit little deterioration after repetitive use, and they are widely used, particularly, as photosensitive members for electrophotography in high-speed copiers, LBPs (laser beam printers), and the like.

As methods for forming such deposit films there are many conventional methods known, including the sputtering process, the method for decomposing raw-material gas by heat (the thermal CVD process), the method for decomposing the raw-material gas by light (the photo-CVD process), the method for decomposing the raw-material gas by plasma (the plasma CVD process), and so on.

Among them, the plasma CVD process, which is a method for decomposing the raw-material gas by glow discharge or the like induced by direct current or high-frequency (RF (Radio Frequency) or VHF (Very High Frequency)) microwave and forming a deposit film of thin film on a substrate of glass, quartz, heat-resistive, synthetic resin film, stainless steel, aluminum, or the like, is used for formation of the a-Si deposit films or the like used not only for electrophotography but also for many semiconductor devices and is under very quick development into practical use. A variety of proposals were also made on apparatus for the process.

Further, demands are becoming stronger for improvements in quality of film and in throughput and many ideas are under research.

Especially, the plasma process using high-frequency power is used because of its various advantages including high stability of discharge, applicability to formation of insulating material such as an oxide film or a nitride film, and so on.

Meanwhile, the copiers of nowadays are required to have high performance and high functionality.

One of such pursuit of high performance is an increase in copy speed. The higher the speed, the shorter the time that can be used for electrification, resulting in the tendency to lower the charge potential. Since the time for exposure must be also decreased similarly, higher sensitivity is also required at the same quantity of light.

One of pursuit of high functionality is multicolor copy. In this case, the distance tends to increase between a charging device and a developing device because of a need for mounting of plural developing devices, so that the surface potential is attenuated during that period, thus tending to lower the charge potential at the position of developing device.

As described above, further improvements in the total characteristics including electrifiability are desired for the electrophotographic, photosensitive member using the a-Si film.

Conventionally, deposition rates for obtaining the a-Si film satisfying the performance of photosensitive member for electrophotography were, for example, those of approximately 0.5 to 6 $\mu$m per hour, and higher deposition rates than those might result in failing to achieve sufficient characteristics for the photosensitive member.

In general, in the case of the a-Si film being utilized as a photosensitive member for electrophotography, at least the film thickness of 20 to 30 $\mu$m is necessary for achieving sufficient electrifiability because of the magnitude of its dielectric constant. This was a cause to raise the fabrication cost, because a long time was necessary for fabrication of photosensitive member for electrophotography. Therefore, there were strong demands for the technology to reduce the fabrication time without degrading the characteristics of the photosensitive member.

One method to meet the recent demand for an improvement in electrifiability and the recent demand for a reduction in deposition time is a report of the plasma CVD process using a high-frequency power supply of 50 MHz or more with a diode parallel plate plasma enhanced CVD system (Plasma Chemistry and Plasma Processing, Vol. 7, No. 3 (1987) pp. 267–273), which indicates the possibility of increasing the deposition rate without degrading the performance of deposit film by using the higher discharge frequency than 13.56 MHz used conventionally and which is drawing attention.

Further, JP-A-3-64466 presents a report on application thereof to the electrophotographic, photosensitive member and research thereof is widely conducted in recent years.

The present inventors investigated the plasma CVD process using the high-frequency power at the high frequency in the so-called VHF band of 50 MHz or more and results thereof demonstrated that an increase in the deposition rate was achieved actually and that an improvement was also observed in the performance of deposit film.

This method, however, has the possibility of raising the following problems at the same time.

Specifically, the normal plasma CVD apparatus is provided with a matching circuit for impedance matching between the high-frequency power supply and the load, but, because impedances are distributed in the discharge electrode in the VHF band, the plasma becomes nonuniform in some cases.

Therefore, the most deposition systems are arranged so that not only the matching circuit but also the discharge electrode itself are optimized so as to keep the plasma discharge uniform and so as to suppress the film thickness distribution of deposit film. Especially in the VHF band, in order to prevent the distribution of impedance in the electrode to which the high-frequency power is applied, the area of the electrode is decreased in many cases.

With the thus optimized apparatus satisfactory results were obtained in film formation of device.

In any device deposition systems by vapor deposition, as well as by the plasma CVD process, unless after fabrication of device a deposit film on a deposition chamber etc. other than the substrate is removed by any method, it will generate particles due to exfoliation or the like in next fabrication, which lowers the non-defective rate of products.

Especially, in the case of devices requiring a thick deposit film like the electrophotographic, photosensitive member, an amount of deposits depositing on the other portions than the substrate, per process is large and cleaning is necessitated every time or at very short cycles unless the configuration of the deposition chamber is designed with special care.

A usually employed method is a method of dry etching for causing plasma discharge in an ambience of fluorine-based gas and gasifying the deposit silicon film thereby so as to remove it, as disclosed in the bulletin of JP-A-59-142839.

However, a problem herein is that the plasma CVD process has such a property that the matching conditions differ depending upon the type of gas used.

For example, in the case of film formation of the a-Si film, a silicon-based gas is used upon formation of film and a fluorine-based gas is used in cleaning as described previously.

However, because the properties of these gases are greatly different, when the plasma discharge of the fluorine gas is excited in the film forming apparatus optimized for uniforming the plasma discharge of the silicon-based gas, uniformity of plasma is destroyed in many cases. This raised a problem that a very long time was necessary for completely removing the deposit film because of localization of plasma when the technique of dry etching described above was applied to cleaning of the deposit film depositing on the inside of the film-forming chamber.

Even in the case of nearly perfect cleaning being achieved, a film also remained at some positions where the plasma was extremely weak, and it became a cause of generating dust upon next film formation, thus degrading image defects in some cases.

Further, the deposit film remaining every process is stacked one over another with repetition of process. After repetition of a certain number of processes, the deposit films must be cleaned off separately by man hand. This additional cleaning raised problems of a decrease in availability of apparatus and a need for labor.

Further, in the normal dry etching process $O_2$ is added in order to raise the etch rate.

For example, in the case of $CF_4$ being used as the fluorine-based gas, dry etching is conducted with addition of $O_2$ gas at a flow rate equal to approximately 10 to 30% of $CF_4$, which can increase an amount of generation of F radicals and which can increase the etch rate.

This case, however, might have a problem that when a diffusion pump is used as an evacuation device, oxygen contacts boiling DP (Diffusion Pump) oil to cause oxidation of oil, thereby greatly decreasing the life of diffusion pump.

A conceivable method for overcoming it is a method for evacuating the chamber by only a mechanical booster pump and a rotary pump as bypassing the diffusion pump only upon dry etching, but in this case, the pressure in the film-forming chamber increases up to considerably high pressure, 0.1 Torr or more.

When the plasma is generated at the high frequency of 50 MHz or more, the localization of plasma becomes worse where the pressure in the discharge space is 0.1 Torr or more. This raises a problem that the etching unevenness described previously becomes further worse in some cases.

SUMMARY OF THE INVENTION

It is, therefore, an object of the present invention to provide a plasma process method and a plasma process apparatus, solving the above problems, that are optimum for forming a desired deposit film, for example, for fabricating an electrophotographic, photosensitive member capable of achieving a high charge potential upon electrification and thus obtaining a high-density image.

It is another object of the present invention to provide a plasma process method and a plasma process apparatus that are optimum for fabricating a deposit film with excellent reproducibility, especially a photosensitive member for electrophotography, in short fabrication time and at low cost.

It is a further object of the present invention to provide a plasma process method and a plasma process apparatus that can decrease the cleaning time remarkably in cleaning the deposit film depositing inside the deposition chamber by the dry etching technique.

It is a still further object of the present invention to provide a plasma process method and a plasma process apparatus that can form a deposit film with less defects, in uniform film thickness, and with uniform characteristics, for example, a deposit film used in a photosensitive member for electrophotography, capable of obtaining clear images with less image defects.

It is a still further object of the present invention to provide a plasma cleaning process method, which comprises introducing a raw-material gas into a deposition chamber while evacuating the inside of the deposition chamber capable of being kept airtight in a vacuum, decomposing the raw-material gas by high-frequency power in the VHF band, performing film formation of a deposit film on a substrate set in the deposition chamber, and thereafter cleaning the inside of the deposition chamber, wherein said film formation is carried out based on decomposition using the high-frequency power in the VHF band, and wherein said cleaning is removing by etching of an unnecessary deposit film depositing inside the deposition chamber, using a gas comprising fluorine and supplying high-frequency power of a lower frequency than that of the high-frequency power upon the film formation.

It is a still further object of the present invention to provide a plasma process apparatus comprising a deposition chamber having an inlet port for introducing a raw-material gas or an etching gas and an exhaust port for evacuating the inside to a vacuum, and a high-frequency power supply for supplying high-frequency power for generating a plasma in the deposition chamber, wherein the high-frequency power supply is arranged to be capable of supplying high-frequency power in the VHF band and high-frequency power in a lower frequency band than the VHF band.

The present invention can achieve the objects of the present invention described above, which is based on the following knowledge of the present inventors.

Namely, the present inventors have conducted extensive and intensive research on the above problems in use of the high-frequency power supply of 50 MHz or more.

In general, when plasma discharge takes place at a high frequency in the VHF band of 50 MHz or more, the electrode to which the power is applied is made in a smaller electrode area than those used at discharge frequencies in the normal RF band, in order to suppress the impedance distribution in the electrode.

With such a smaller-area cathode electrode the balance of optimum values is lost with a great change in the type of gas subjected to discharge, thereby producing a distribution of plasma.

Further, in the case of a deposit film forming apparatus using the diffusion pump in its exhaust system, use of oxygen-based gas is not allowed and in the case of a deposit film forming apparatus using a turbo molecular pump, a negative effect could appear due to dust of $SiO_2$ generated upon etching. For this reason, evacuation is often carried out using the mechanical booster pump and the rotary pump while bypassing the diffusion pump or the turbo molecular pump upon dry etching, so that the vacuum in the discharge space must become 0.1 Torr to several Torr.

Therefore, further localization of plasma occurs in discharge in the VHF region, likely to localize the plasma, and it is thus difficult to effect uniform dry etching throughout the entire region in the apparatus.

The present inventors have conducted extensive and intensive research on means for dry etching with an apparatus having a far smaller cathode area than that of the normal RF plasma CVD apparatus, which is capable of producing a uniform plasma under the internal pressure in the discharge space being in a high pressure range of 0.1 Torr to several Torr, thereby effecting uniform dry etching throughout the deposition chamber and at relatively high etch rates. After checking various discharge frequencies and various types of etchant gases, the inventors found out that as to the dry etching, the plasma spread all over the deposition chamber even under the above discharge conditions, thereby uniformly etching the deposit film where the high-frequency power was in the RF band of 20 MHz or less but not in the VHF band and where the etchant gas was a gas containing fluorine, especially, at least one of $CF_4$, $CF_mH_n$ (m+n=4), and $ClF_3$, combined, if necessary, with $O_2$, Ar, $N_2$, or $H_2$.

From the above knowledge, the present inventors have come to find out that for fabricating relatively thick devices like the electrophotographic, photosensitive member in short time and at low cost, upon film formation with a gas compound containing at least silicon, the film was able to be formed uniformly at higher deposition rates than before and the quality of deposit film was able to be also improved, by applying the power at a higher frequency of 50 MHz or more to the optimized electrode of small area.

Especially, the inventors have found that upon cleaning of the deposition chamber after completion of one batch of film formation, the entire space in the deposition chamber (in the film-forming furnace) was able to be dry-etched uniformly whereby cleaning was able to be made in the shortest time and without a remaining deposit film, by applying the high-frequency power at a lower frequency of 20 MHz or less and keeping the discharge space under high pressure of 0.1 Torr or more and by causing discharge in a gas ambience containing at least one of $CF_4$, $CF_mH_n$ (m+n=4), and $ClF_3$ and, if necessary, further containing $O_2$, Ar, $N_2$, or $H_2$.

In the present invention, preferably, the internal pressure in the deposition chamber upon the film formation is between 0.1 mTorr and 100 mTorr and the internal pressure in the deposition chamber upon the cleaning is between 0.1 Torr and 10 Torr.

In the present invention, the frequency of the high-frequency power upon the film formation is preferably between 50 MHz and 450 MHz both inclusive and more preferably between 50 MHz and 105 MHz both inclusive.

In the present invention, the frequency of the high-frequency power upon the cleaning is preferably between 1 MHz and 20 MHz both inclusive and more preferably, 13.56 MHz.

DETAILED DESCRIPTION OF THE PREFERRED EMBODIMENTS

The present invention will be described in detail with reference to the drawings.

Figure 1:
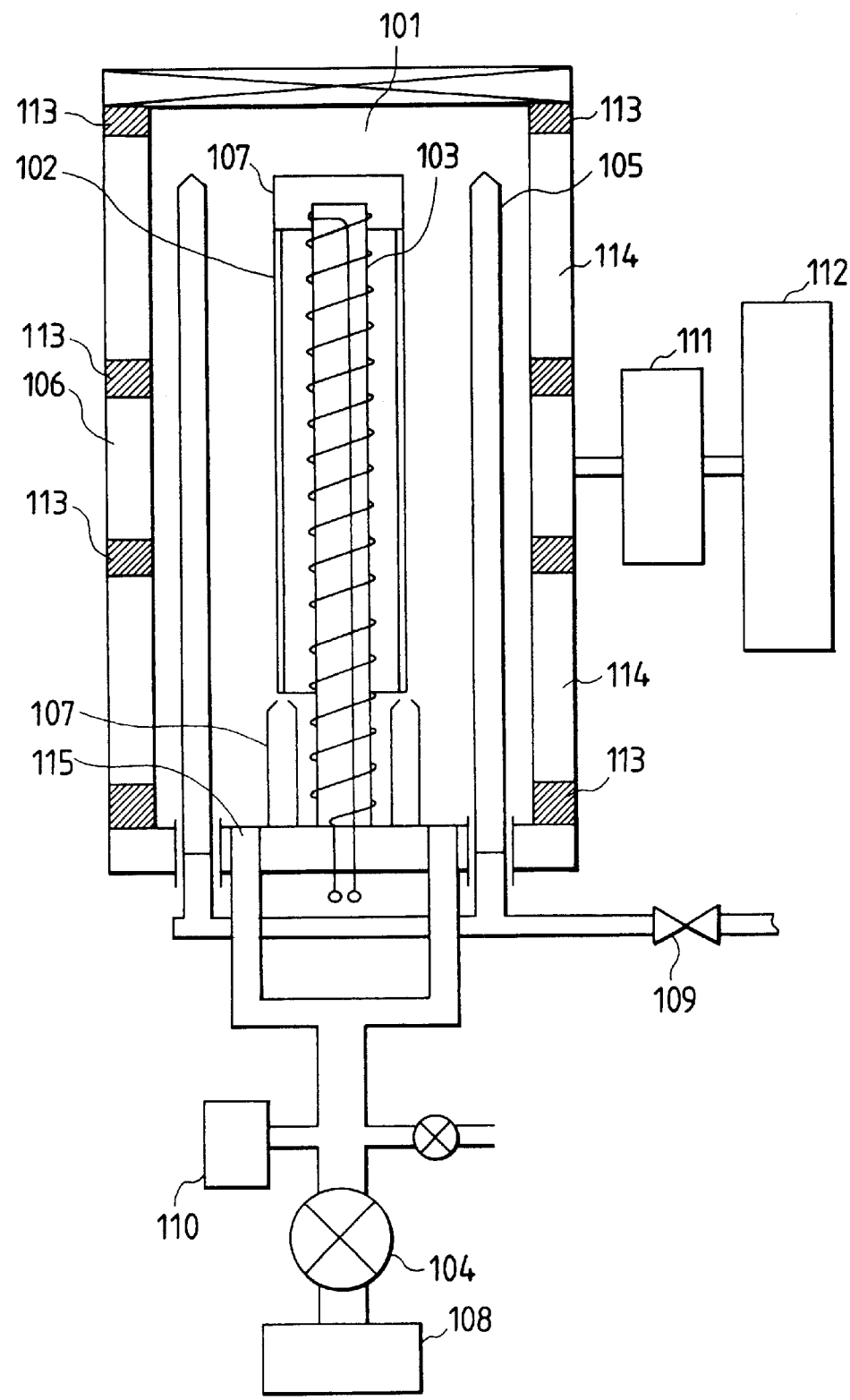
FIGS. 1, 2, 3, 4 and 5 are schematic, cross-sectional, structural drawings each for explaining a preferred example of the plasma process apparatus according to the present invention.

FIG. 1 is a schematic diagram to show an example of the apparatus for carrying out the method according to the present invention, which is a deposit film forming apparatus of a so-called coaxial type in which a second electrode is installed so as to surround a cylindrical substrate like a photosensitive member for electrophotography.

In FIG. 1 reference numeral 101 designates a deposition chamber for forming a deposit film, which is connected through exhaust port 115 to evacuation device 108 by main valve 104. Suitably applicable examples of the evacuation device 108 include a combination of the mechanical booster pump with the rotary pump, a combination of the diffusion pump with the rotary pump, and so on.

These evacuation devices may be provided with a variable conductance valve, if necessary.

Numeral 109 denotes a raw-material gas introducing valve for introducing the raw-material gas into the deposition chamber, which introduces the raw-material gas from a gas supply system not illustrated into the deposition chamber.

The raw-material gas is discharged from gas discharge pipes 105 standing in the deposition chamber into the discharge space. The pressure inside the deposition chamber upon introduction of the raw-material gas can be monitored by pressure gage 110.

The optimum degree of vacuum differs in some cases between in the plasma CVD process at the frequency below 20 MHz and in the plasma CVD process at the frequency between 50 MHz and 450 MHz both inclusive. In this case, each optimum degree of vacuum may be adjusted by evacuating the chamber by only the rotary pump while bypassing the unrepresented diffusion pump of the evacuation device 108 described above by an unrepresented bypass pipe, by adjusting the driving frequency of the mechanical booster pump, or by using a separate variable conductance valve.

Numeral 102 represents a first electrode also serving as a film-formed substrate connected to the earth, and auxiliary substrates 107 are provided over and under the film-formed substrate.

Numeral 103 denotes a heating heater for heating the substrate to a predetermined temperature. Although this schematic diagram shows the fixed arrangement of the film-formed substrate, the substrate may be rotated by a rotating mechanism, if necessary, thereby further uniforming the film thickness in the circumferential direction.

Numeral 112 stands for a high-frequency power supply for generating the high-frequency power in the range of 50 MHz to 450 MHz or in the range of 20 MHz or less, which is wired so that the high-frequency power is applied through matching circuit 111 to the second electrode 106.

The second electrode 106 is so optimized as to uniform the plasma state in the plasma CVD process at the frequency between 50 MHz and 450 MHz both inclusive and the axial length thereof is properly adjusted so that it has a smaller area than the total area of the first electrode 102 and auxiliary substrates 107, as illustrated schematically.

As illustrated, the second electrode 106 may also serve as an internal wall of the deposition chamber 101, of course.

This schematic diagram shows the example in which the length is adjusted using internal walls 114 electrically insulated by insulators 113.

Figure 2:
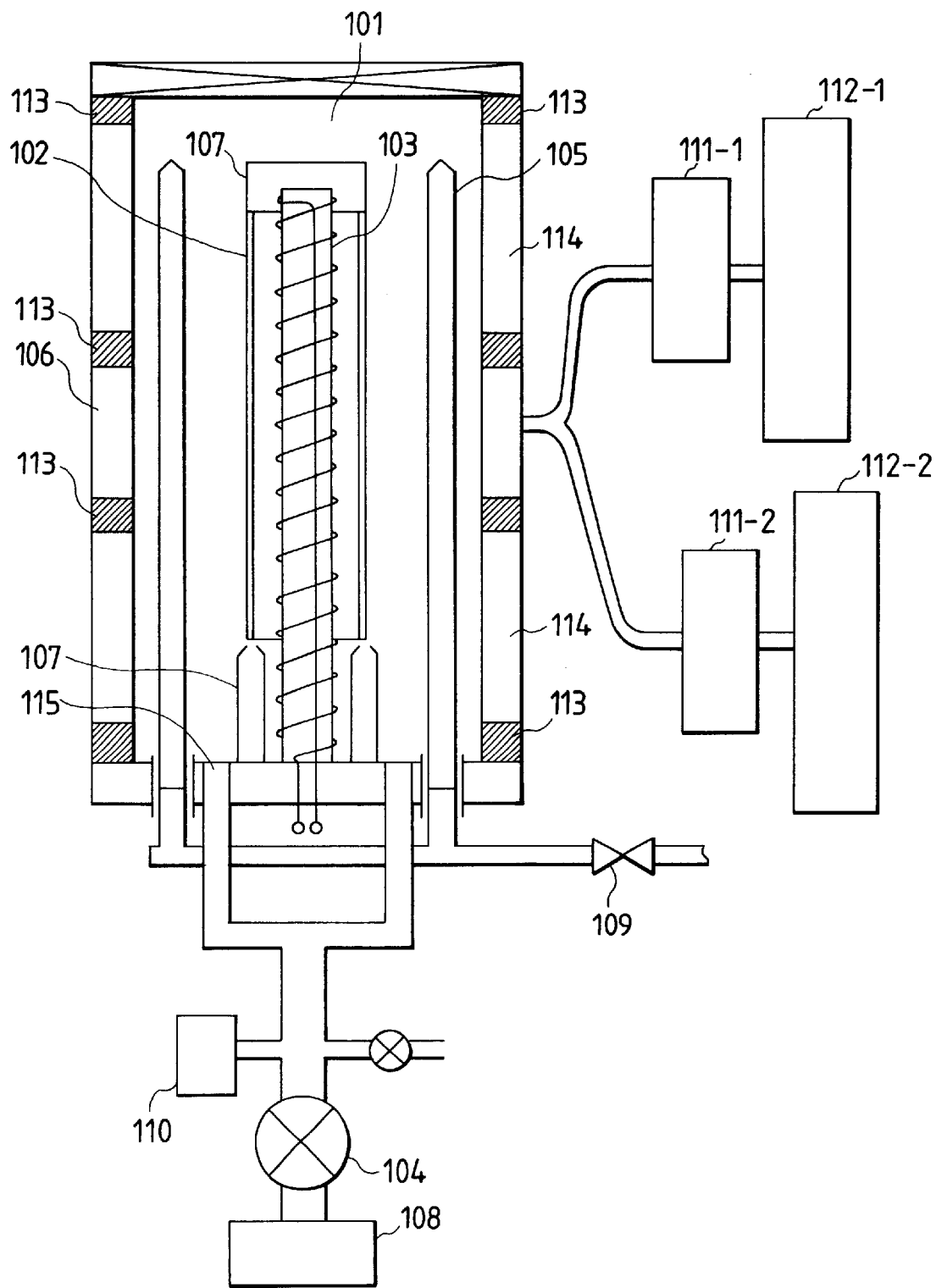

Switching of frequency may be achieved by switching the set of high-frequency power supply 112 and matching circuit 111 each to another according to the frequency. FIG. 2 schematically shows such an arrangement. As shown in FIG. 2, the apparatus may be arranged to have high-frequency power supply 112-1 for generating the high-frequency power at the frequency in the VHF band, matching circuit 111-1 provided corresponding thereto, high-frequency power supply 112-2 for generating the high-frequency power at a lower frequency than the foregoing frequency, and matching circuit 111-2 provided corresponding thereto. Although FIG. 2 shows one line for combining power supply lines extending from the matching circuits 111-1 and 111-2 midway, the power supply lines may be connected separately to the electrode. Further, the power supply lines may be connected to different electrodes or to separate electrodes provided according to the frequencies applied, if necessary.

Figure 3:
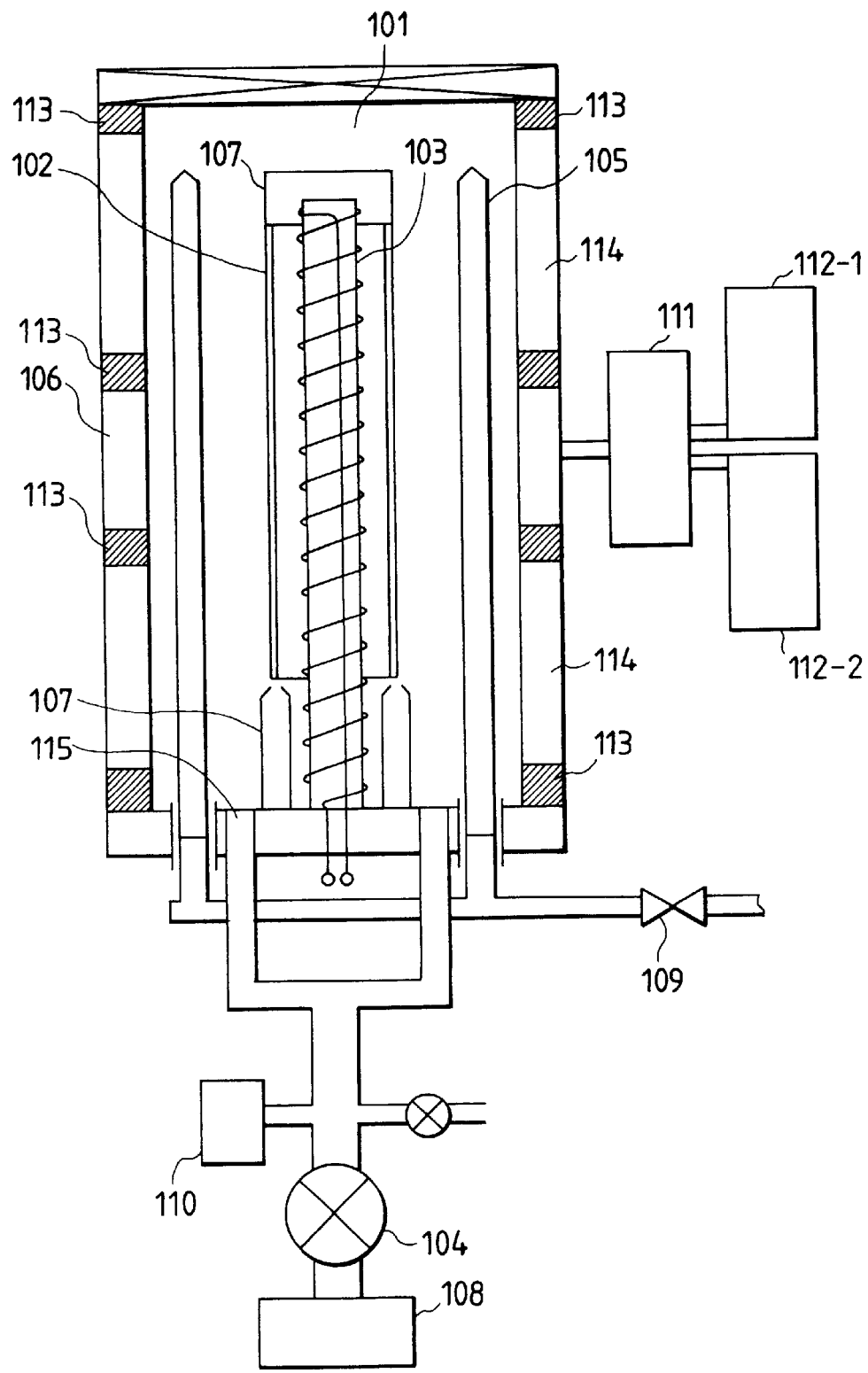

In another arrangement, as shown in FIG. 3, the matching circuit 111 may be used in common if it is a matching circuit with a wide matching range and only the high-frequency power supplies 112-1, 112-2 having different frequency ranges may be arranged to be switched one from another.

Figure 4:
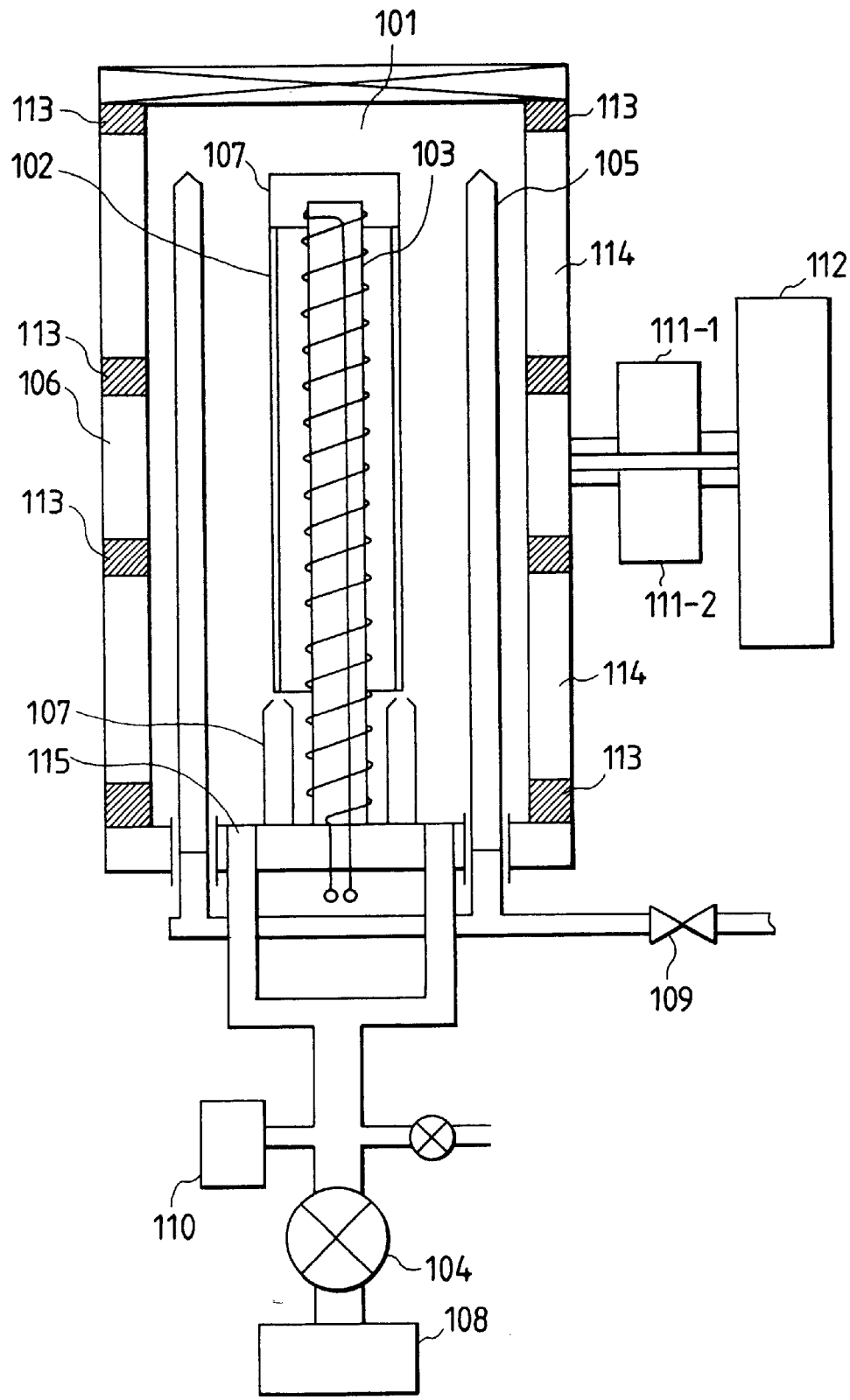

In a further arrangement, as shown in FIG. 4, only the matching circuits 111-1, 111-2, one suitable for the frequencies in the VHF band and the other suitable for lower frequencies than the foregoing, may be arranged to be switched one from another and the high-frequency power supply 112 may be arranged as capable of changing its frequency.

An advantageous arrangement is the one using the matching circuit with a wide matching range and the high-frequency power supply that can change the frequency between one of 20 MHz or less and one of 50 MHz or more, because the method of the present invention can be achieved without changing the matching circuit 111 and the high-frequency power supply 112 into other ones.

Figure 5:
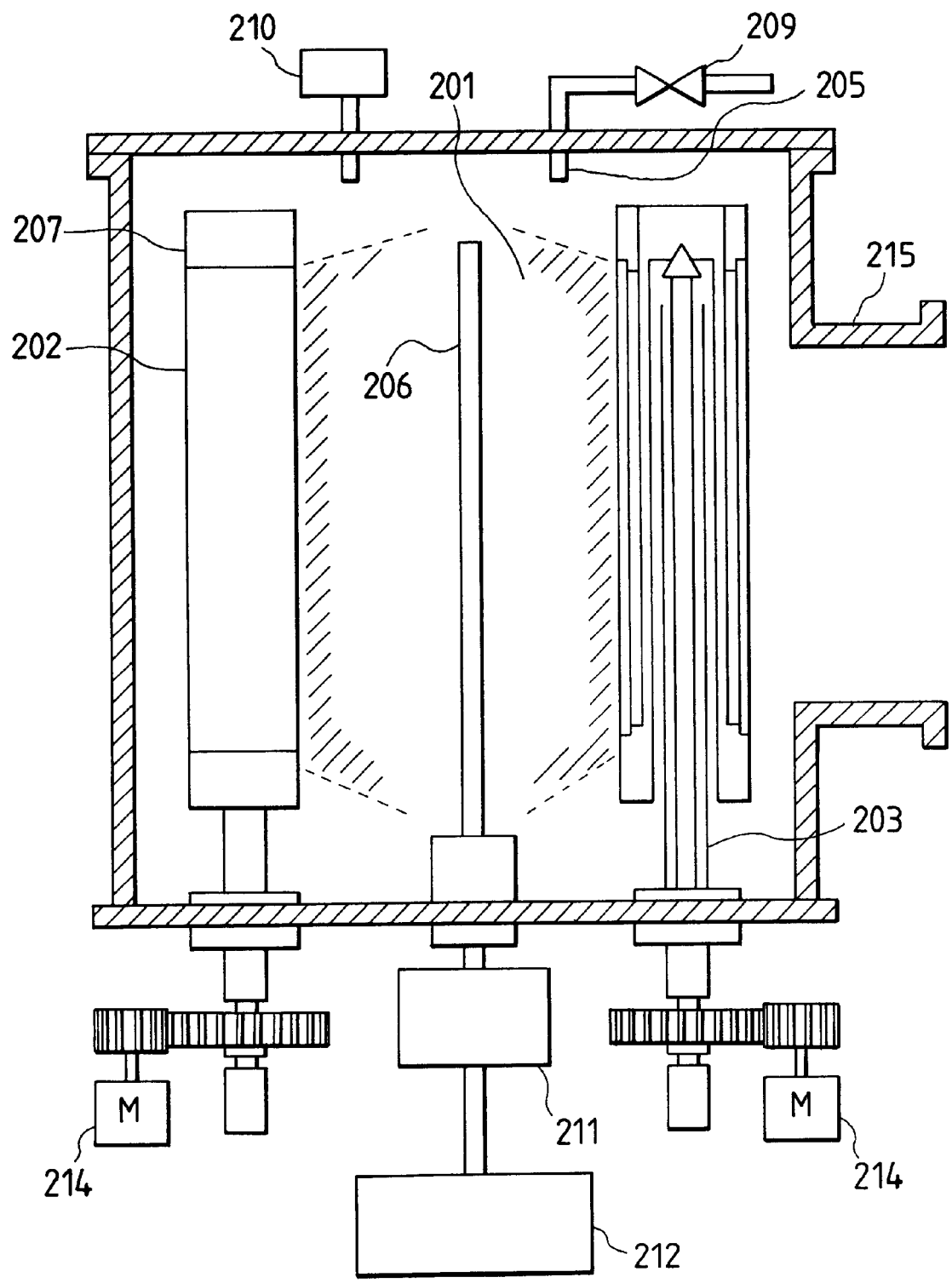

FIG. 5 is a schematic diagram to show an example of still another apparatus for carrying out the method of the present invention, which is a deposit film forming apparatus of a type in which cylindrical substrates like the photosensitive member for electrophotography are arranged on a concentric circle and in which discharge is excited in the space surrounded by the substrates.

In FIG. 5, reference numeral 201 designates a deposition chamber for forming a deposit film, which has a configuration surrounded by cylindrical substrates 202 also serving as a first electrode.

The deposition chamber 201 is connected through exhaust port 215 to the evacuation device not shown. Suitably applicable examples of the evacuation device not shown include the combination of the mechanical booster pump with the rotary pump, the combination of the diffusion pump with the rotary pump, and so on.

A variable conductance valve may be attached to the exhaust port 215, if necessary.

Numeral 209 represents a raw-material gas introducing valve for introducing the raw-material gas into the deposition chamber, which introduces the raw-material gas from the gas supply system not illustrated into the deposition chamber. The raw-material gas is discharged from gas discharge pipes 205 standing in the deposition chamber into the discharge space. The pressure inside the deposition chamber upon introduction of the raw-material gas can be monitored by pressure gage 210.

The optimum degree of vacuum differs in some cases between in the plasma CVD process at the frequency below 20 MHz and in the plasma CVD process at the frequency between 50 MHz and 450 MHz both inclusive. In this case, each optimum degree of vacuum may be adjusted by evacuating the chamber by only the rotary pump while bypassing the unrepresented diffusion pump of the evacuation device described above by an unrepresented bypass pipe, by adjusting the driving frequency of the mechanical booster pump, or by using a separate variable conductance valve.

Numeral 202 denotes a first electrode also serving as film-deposited substrates connected to the earth and auxiliary substrates 207 are provided over and under each film-formed substrate. Numeral 203 is a heating heater for heating the substrates up to a predetermined temperature. Each film-formed substrate 202 is arranged to be rotated by a rotating mechanism 214 whereby a uniform film can be deposited over the entire surface thereof in the circumferential direction. Numeral 212 denotes the high-frequency power supply for generating the high-frequency power in the range of 50 MHz to 450 MHz or in the range of 20 MHz or less, which is wired so that the high-frequency power is applied through the matching circuit 211 to the second electrode 206.

The second electrode 206 is formed so that the electrode area thereof is much smaller than that of the first electrode 202 so as to be capable of introducing the uniform power at the frequency between 50 MHz and 450 MHz both inclusive into the deposition chamber 201. The optimum apparatus configuration can be achieved by properly adjusting the axial length of the second electrode 206.

For switching of frequency in practice, both high-frequency power supply 212 and matching circuit 211 are switched to another set or only the high-frequency power supply is switched to another of different frequency while the matching circuit 211 is used in common if it is a matching circuit with a wide matching range, thus achieving the present invention. In the case wherein the matching circuit is one with a wide matching range and wherein the high-frequency power supply is one capable of changing its frequency in the range of 20 MHz to 50 MHz both inclusive, the method of the present invention can be achieved advantageously without switching of the matching circuit 211 and the high-frequency power supply 112. If the high-frequency power supply is one capable of changing its frequency in the necessary frequency range, the matching circuit may be switched to another according to the frequency.

The high-frequency power supplies applicable herein are any power supplies if they are the power supply for generating the power at the frequency below 20 MHz and the power supply for generating the power in the range of from 50 MHz to 450 MHz. The high-frequency power supply of a type capable of changing the oscillation frequency, especially capable of changing the frequency between one of 20 MHz or less and one of 50 MHz or more, can be suitably applied to the method of the present invention. Any output is suitably applicable if it can generate the power suitable for the apparatus and specifications, in the range of from 10 W to 5000 W or more.

Further, the effects of the present invention can be achieved even if the output regulation of the high-frequency power supply is any value.

As for the matching circuit used herein, any configuration is suitably applicable if it can achieve matching between the high-frequency power supply and the load.

The matching method is preferably one automatic adjustment in order to avoid cumbersome work upon manufacturing, but the matching method by manual adjustment can also be applied without affecting the effects of the present invention at all. As for the position where the matching circuit is located, no problem arises when it is set at any position in the matching-possible range, but a desired arrangement is such that the inductance of the wire between the matching circuit and the second electrode is as small as possible, because the arrangement makes it possible to achieve matching in a wide range of load conditions.

An example of the method for forming the deposit film according to the present invention with the deposit film forming apparatus of FIG. 1 is carried out in the following procedures.

First, the auxiliary substrates 107 are attached to the film-formed substrate (also serving as the first electrode) 102 the surface of which was mirror-finished with a lathe, for example, and the film-formed substrate 102 and auxiliary substrates 107 are set around the heating heater 103 in the deposition chamber 101.

Next, the inside of the deposition chamber is once evacuated through the exhaust port 115 with the raw-material gas introducing valve 109 close and with the main valve 104 open and thereafter the raw-material gas introducing valve 109 is opened to introduce an inert gas for heating, for example argon, through the raw-material gas discharge pipes 105 into the deposition chamber. The flow rate of the gas for heating is controlled as monitoring the pressure gage 110 so as to keep the inside of the deposition chamber under desired pressure.

After that, a temperature controller not illustrated is actuated to heat the substrate 102 by the heating heater 103. When the substrate 102 is heated up to the desired temperature, the raw-material gas introducing valve 109 is closed to stop the flow of gas into the deposition chamber 101.

For forming the deposit film, the raw-material gas introducing valve 109 is opened to introduce a predetermined raw-material gas, for example, a material gas such as silane gas, disilane gas, methane gas, or ethane gas, and a doping gas such as diborane gas or phosphine gas, through the raw-material gas discharge pipes 105 into the deposition chamber 101, and the evacuation rate is adjusted so as to maintain the desired pressure in the range of several mTorr to several 100 mTorr.

During film formation of electrophotographic, photosensitive member the high vacuum in the range of several mTorr to several 100 mTorr is preferred in order to prevent the localization of plasma and to make the film thickness distribution uniform. For this purpose, the evacuation system may be a combination of the rotary pump with the diffusion pump or the turbo molecular pump and the pressure may be adjusted by a method for properly adjusting the valve travel of main valve 104, or by a method for adjusting the pressure using a conductance adjuster valve not illustrated.

After the pressure is stabilized, the power from the high-frequency power supply 112 is supplied to generate glow discharge. At this time the high-frequency power with the oscillation frequency between 50 MHz and 450 MHz both inclusive is supplied for the film formation of electrophotographic, photosensitive member.

In either case the matching circuit 111 is adjusted so as to minimize reflected waves. After a film is formed in the desired thickness as adjusting subtraction of the reflected power from the high-frequency input power at a desired value, the glow discharge is stopped and the raw-material gas introducing valve 109 is closed to stop the flow of the raw-material gas into the deposition chamber 101 and to evacuate the inside of the deposition chamber once to a high vacuum, then completing the formation of layer.

This process is repeated a desired number of times to stack deposit films having various functions, thus producing an electrophotographic, photosensitive member.

After the electrophotographic, photosensitive member is produced, it is cooled before the temperature of the substrate becomes 100° C. or less. Then a leak valve is opened to raise the pressure inside the deposition chamber to the atmospheric pressure and the electrophotographic, photosensitive member after completion of film formation is taken out thereof. In order to prevent damage on the heating heater 103, dummy cylindrical substrate 102 and auxiliary substrates 107 are set instead in the deposition chamber and the inside of the chamber is vacuumized in the same procedure as above. Then introduced into the deposition chamber is a gas for etching, which is a gas containing fluorine, for example, at least one of $CF_4$, $CF_mH_n$ (m+n=4), and $ClF_3$, to which $O_2$, Ar, $N_2$, or $H_2$ is further added, if necessary.

In order to excite discharge, the pressure inside the chamber is controlled at the internal pressure of 0.1 Torr to several Torr.

A preferable evacuation system is the combination of the rotary pump with the mechanical booster pump. If the diffusion pump or the turbo molecular pump is used, a desirable arrangement will be such that evacuation is effected by only the rotary pump and mechanical booster pump while bypassing the diffusion pump or the turbo molecular pump by a bypass pipe in order to avoid damage thereon.

On this occasion the internal pressure may be adjusted by a method for properly adjusting the valve travel of main valve 104, a method for adjusting the pressure using a conductance adjuster valve not illustrated, or a method for adjusting the rotation frequency of the mechanical booster pump.

After the pressure is stabilized, the power of the high-frequency power supply 112 is supplied to generate glow discharge. The high-frequency power supply 112 is one with the oscillation frequency in the range of 20 MHz and less and the matching circuit 111 is adjusted to minimize the reflected waves. After a desired time has elapsed as adjusting subtraction of the reflected power from the high-frequency input power at a desired value, the glow discharge is stopped and the raw-material gas introducing valve 109 is closed to stop the flow of the etching gas into the deposition chamber 101 and evacuate the inside of the deposition chamber once to a high vacuum. After that, the dry etching is ended.

An example of the method for forming the deposit film according to the present invention with the deposit film forming apparatus of FIG. 5 is carried out in the following procedures. First, the auxiliary substrates 207 are attached to each film-formed substrate (also serving as the first electrode) 202 the surface of which was mirror-finished with the lathe, for example, and each set of film-formed substrate 202 and auxiliary substrates 207 are set around the heating heater 203 in the deposition chamber 201. Next, the inside of the deposition chamber is once evacuated through the exhaust port 215 with the raw-material gas introducing valve 209 close and thereafter the raw-material gas introducing valve 209 is opened to introduce an inert gas for heating, for example argon, through the raw-material gas discharge pipe 205 into the deposition chamber. The flow rate of the gas for heating is controlled as monitoring the pressure gage 210 so as to keep the inside of the deposition chamber under desired pressure. After that, a temperature controller not illustrated is actuated to heat the substrates 202 by the heating heaters 203. When the substrates 202 are heated up to the desired temperature, the raw-material gas introducing valve 209 is closed to stop the flow of gas into the deposition chamber.

For forming the deposit film, the raw-material gas introducing valve 209 is opened to introduce a predetermined raw-material gas, for example, a material such as silane gas, disilane gas, methane gas, or ethane gas, and a doping gas such as diborane gas or phosphine gas, through the raw-material gas inlet port 205 into the deposition chamber 201, and the evacuation rate is adjusted so as to maintain the desired pressure in the range of several mTorr to several Torr.

Specific examples of the method for adjusting the pressure include the method for properly adjusting the valve travel of the main valve not illustrated, the method for adjusting the pressure using a conductance adjuster valve not illustrated, the method for adjusting the rotation frequency of the mechanical booster pump in the case of the combination of the mechanical booster pump with the rotary pump being used as the evacuation system not illustrated, and so on.

During film formation of electrophotographic, photosensitive member the high vacuum in the range of several mTorr to several 100 mTorr is preferred in order to prevent the localization of plasma and to make the film thickness distribution uniform. For this purpose, the evacuation system may be a combination of the rotary pump with the diffusion pump or the turbo molecular pump and the pressure may be adjusted by a method for properly adjusting the valve travel of main valve 204, or by a method for adjusting the pressure using a conductance adjuster valve not illustrated.

After the pressure is stabilized, the power from the high-frequency power supply 212 is supplied to generate glow discharge. At this time the high-frequency power with the oscillation frequency between 50 MHz and 450 MHz both inclusive is supplied.

In either case the matching circuit 211 is adjusted so as to minimize the reflected waves. After a film is formed in the desired thickness as adjusting subtraction of the reflected power from the high-frequency input power at a desired value, the glow discharge is stopped and the raw-material gas introducing valve 209 is closed to stop the flow of the raw-material gas into the deposition chamber 201 and to evacuate the inside of the deposition chamber once to a high vacuum, then completing the formation of layer. This process is repeated a desired number of times to stack deposit films having various functions, thus producing electrophotographic, photosensitive members.

After the electrophotographic, photosensitive members are produced, they are cooled before the temperature of the substrates becomes 100° C. or less. Then the leak valve is opened to raise the pressure inside the deposition chamber to the atmospheric pressure and the electrophotographic, photosensitive members after completion of film formation are taken out thereof.

In order to prevent damage on the heating heaters 203, dummy cylindrical substrates 202 and auxiliary substrates 207 are set instead in the deposition chamber and the inside of the chamber is vacuumized in the same procedure as above. Then introduced into the deposition chamber is a gas for etching, which is a gas containing fluorine, for example, at least one of $CF_4$, $CF_mH_n$ (m+n=4), and $ClF_3$, to which $O_2$, Ar, $N_2$, or $H_2$ is further added, if necessary. In order to excite discharge, the pressure inside the furnace this time is controlled at the internal pressure of 0.1 Torr to several Torr.

A preferable evacuation system is the combination of the rotary pump with the mechanical booster pump. If the diffusion pump or the turbo molecular pump is used, a desirable arrangement will be such that evacuation is effected by only the rotary pump and mechanical booster pump while bypassing the diffusion pump or the turbo molecular pump by a bypass pipe in order to avoid damage thereon. On this occasion the internal pressure may be adjusted by a method for properly adjusting the valve travel of the main valve not illustrated, a method for adjusting the pressure using a conductance adjuster valve not illustrated, or a method for adjusting the rotation frequency of the mechanical booster pump.

After the pressure is stabilized, the power of the high-frequency power supply 212 is supplied to generate glow discharge. The high-frequency power supply 212 is one with the oscillation frequency in the range of 20 MHz and less and the matching circuit 211 is adjusted to minimize the reflected waves.

After a desired time has elapsed as adjusting subtraction of the reflected power from the high-frequency input power at a desired value, the glow discharge is stopped and the raw-material gas introducing valve 209 is closed to stop the flow of the etching gas into the deposition chamber 201 and evacuate the inside of the deposition chamber once to a high vacuum. After that, the dry etching is ended.

In either apparatus of FIG. 1 or FIG. 5, supposing a changing layer with continuously changing composition or the like is provided between layers, for example, supposing an intermediate layer is provided between the photoconductive layer and the surface layer, it is possible to employ a method for forming the photoconductive layer by the above operation and thereafter continuously changing the flow rate condition of raw-material gas gradually from the flow rate condition of raw-material gas upon formation of the photoconductive layer to that upon formation of the surface layer without stopping the supply of high-frequency power, or the like.

At the same time as the change of the flow rate of raw-material gas, the output of high-frequency power supply 112, 212, the main valve 104, etc. should be adjusted with necessity so as to achieve the desired conditions upon formation of the changing layer.

It is needless to mention that during the change of the flow rate of raw-material gas sufficient care should be taken to avoid an extreme pressure change due to sudden ejection of gas or the like. The thickness of this changing region is determined to be as thick as an interface is substantially formed between the photoconductive layer and the surface layer, as described above.

During formation of each layer the all other flow-out valves than that for necessary gas are closed, of course, and the operation for evacuating the inside once to a high vacuum is carried out with necessity in order to avoid each gas from remaining in the reaction chamber 101, 201 and in the pipe of the gas supply system. It is also needless to mention that the type of gas and the valve operation described above are changed depending upon the production conditions of each layer.

The material for the second electrode is selected preferably from copper, aluminum, gold, silver, platinum, lead, nickel, cobalt, iron, chromium, molybdenum, titanium, stainless steel, and composite materials containing two or more of these materials. A preferred shape is a cylinder, but it may be an oval or a polygon as occasion may demand. The second electrode may be provided with a cooling device with necessity. Specific examples of the cooling means include cooling by water, air, liquid nitrogen, Peltier element, or the like, which is selected depending upon the purpose.

The first electrode of the present invention also functions as a substrate on which the film is to be formed, which may be any substrate of material and shape according to the application purpose.

For example, the shape is desirably cylindrical in the case of application to the photosensitive member for electrophotography, but the shape may be of a flat plate or any other shape as occasion may demand.

The material for the substrate is selected preferably from copper, aluminum, gold, silver, platinum, lead, nickel, cobalt, iron, chromium, molybdenum, titanium, stainless steel, and composite materials containing two or more of these materials, and also from structures having an electroconductive material coating over an insulating material such as polyester, polyethylene, polycarbonate, cellulose acetate, polypropylene, polyvinyl chloride, polyvinylidene chloride, polystyrene, glass, ceramics, or paper.

The substrate temperature of the cylindrical substrate is generally between 100° C. and 400° C. both inclusive, preferably between 150° C. and 350° C. both inclusive, and more preferably between 200° C. and 350° C. both inclusive, for decreasing dangling bonds in the film and for making the film finer.

The heat generating element constituting the heating heater of substrate may be any heat generating element constructed in vacuum specifications. More specifically, it is selected from electric resistance heating elements such as a sheath heater, a plate heater, a ceramic heater, or a carbon heater, heating elements by heat exchange means with a thermal medium of liquid, gas, or the like, and so on. A heat radiating lamp heating element such as a halogen lamp or an infrared lamp may also be applied suitably as the heating heater of substrate in the present invention, but in this case it is necessary to form temperature gradient by installing a higher power lamp at the end of heater than the lamp installed at the center.

The material for the surface of the heating means may be selected from metals such as stainless steel, nickel, aluminum, or copper, ceramic, heat-resistant polymer resins, and so on.

The shape of the substrate used in the present invention may be a cylindrical or plate endless belt shape of either a smooth surface or a rough surface. The thickness thereof may be properly determined so as to form a light receiving member for electrophotography as desired, but if flexibility of a light receiving member for electrophotography is demanded, the substrate can be made as thin as possible within the scope where the function of the substrate can be demonstrated fully.

However, the thickness of the substrate is normally 10 $\mu$m or more in terms of fabrication, handling, mechanical strength, and so on.

Especially, in the case wherein image recording is carried out using coherent light such as laser light, the surface of substrate may be provided with projections and depressions in order to effectively cancel out defects of image due to so-called interference fringe patterns appearing in a visible image.

The projections and depressions formed in the surface of substrate are made by the well-known method as described in the bulletin of JP-A-60-168156, JP-A-60-178457, or JP-A-60-225854.

Another method for effectively canceling out the defects of image due to the interference fringe patterns in use of the coherent light such as the laser light is a rough surface with a plurality of spherical trace pits made in the surface of substrate.

Specifically, the surface of substrate has smaller projections and depressions than the resolution that the light receiving member for electrophotography is required to have and the projections and depressions are based on the plurality of spherical trace pits. The projections and depressions based on the plurality of spherical trace pits made in the surface of substrate are produced by the well-known method as described in the bulletin of JP-A-61-231561.

The charge injection preventing layer of the electrophotographic, photosensitive member suitably fabricated by the fabrication apparatus of the present invention has a function to prevent the charge from being injected from the substrate to the photoconductive layer when the light receiving layer is subjected to electrification of a fixed polarity on the free surface thereof, and it has so-called polarity dependence that the function does not take place when the light receiving layer is subjected to electrification of the opposite polarity.

For providing the charge injection preventing layer with this function, the charge injection preventing layer contains a relatively larger amount of atoms for controlling conductivity type than the photoconductive layer does.

The atoms for controlling conductivity type in the preventing layer may be distributed all around and uniformly in the layer, or some portions may contain the atoms in a nonuniformly distributed state though containing them all around in the direction of film thickness. In the case of the nonuniform distribution of concentration, a preferred distribution is one containing the atoms distributed more on the substrate side.

In either case, however, the atoms need to be distributed uniformly and all around in the in-plane direction parallel to the surface of substrate in order to uniform the characteristics in the in-plane direction.

Specific examples of the atoms for controlling conductivity type in the charge injection preventing layer are so-called impurities in the semiconductor fields, more specifically, atoms giving the p-type conduction characteristic and belonging to Group IIIb in the periodic table (hereinafter referred to as "IIIb-atoms") or atoms giving the n-type conduction characteristic and belonging to Group Vb in the periodic table (hereinafter referred to as "Vb-atoms").

Specific examples of the IIIb-atoms are B (boron), Al (aluminum), Ga (gallium), In (indium), Tl (thallium), and so on and particularly, B, Al, and Ga are preferably applicable. Specific examples of the Vb-atoms are P (phosphorus), As (arsenic), Sb (antimony), Bi (bismuth), and so on and particularly, P and As are preferably applicable.

A content of the atoms contained in the charge injection preventing layer, for controlling conductivity type, is properly determined as desired to effectively achieve the object of the present invention, which is desirably determined to be preferably 10 to $1 \times 10^4$ atomic ppm, more preferably 50 to $5 \times 10^3$ atomic ppm, and most preferably $1 \times 10^2$ to $1 \times 10^3$ atomic ppm.

Further, when the charge injection preventing layer contains at least one kind of carbon, nitrogen, and oxygen, adherence can be enhanced further to another layer provided in direct contact with the charge injection preventing layer.

The carbon atoms, nitrogen atoms, or oxygen atoms contained in the layer may be distributed all around and uniformly in the layer, or some portions may contain them in a nonuniformly distributed state though containing them all around in the direction of film thickness.

In either case, however, the atoms need to be distributed uniformly and all around in the in-plane direction parallel to the surface of substrate in order to uniform the characteristics in the in-plane direction.

A content of the carbon atoms and/or the nitrogen atoms and/or the oxygen atoms contained in the entire region of the charge injection preventing layer is preferably determined so as to effectively achieve the object of the present invention, and is desirably determined to be preferably $1 \times 10^{-3}$ to 50 atomic %, more preferably $5 \times 10^{-3}$ to 30 atomic %, and most preferably $1 \times 10^{-2}$ to 10 atomic %, each of which, in the case of one kind, is a content thereof or each of which, in the case of two or more kinds, is a sum of their contents.

Hydrogen atoms and/or halogen atoms contained in the charge injection preventing layer compensate for dangling bonds present in the layer and are thus effective in improving the quality of film. A content of the hydrogen atoms or the halogen atoms or a total content of the hydrogen atoms and halogen atoms in the charge injection preventing layer is desirably determined to be preferably 1 to 50 atomic %, more preferably 5 to 40 atomic %, and most preferably 10 to 30 atomic %.

The film thickness of the charge injection preventing layer is desirably determined to be preferably 0.1 to 5 $\mu$m and most preferably 1 to 4 $\mu$m in order to achieve the desired electrophotographic characteristics, economical effect, and so on.

For forming the charge injection preventing layer with the characteristics capable of achieving the object of the present invention, it is necessary to properly set a mixture ratio of gas for supply of Si and diluent gas, the gas pressure in the reaction vessel, the discharge power, and the temperature of the substrate.

The optimum range of flow rate of $H_2$ and/or He as the diluent gas is properly selected according to the design of layer, but a desired example is such that $H_2$ is controlled against the gas for supply of Si normally in the range of 1 to 20 times, preferably in the range of 3 to 15 times, and most preferably in the range of 5 to 10 times. The optimum range of the discharge power is also properly selected according to the design of layer, but a desired example is such that the discharge power is set against the flow rate of the gas for supply of Si normally in the range of 0.5 to 7 W/sccm, preferably in the range of 1 to 6 W/sccm, and most preferably in the range of 1.5 to 5 W/sccm.

The photoconductive layer of the electrophotographic, photosensitive member suitably fabricated by the fabricating apparatus of the present invention needs to contain hydrogen atoms or/and halogen atoms, which are necessary and indispensable for compensating for the dangling bonds of silicon atoms, thereby improving the quality of film and, particularly, improving the photoconductivity and charge holding characteristics. Accordingly, a content of hydrogen atoms or halogen atoms or a content of the sum of hydrogen atoms and halogen atoms is desirably determined to be 10 to 30 atomic % and more preferably 15 to 25 atomic % with respect to the sum of silicon atoms and the hydrogen atoms and/or halogen atoms.

Effectively applicable substances as the gas for supply of Si used in the present invention include gas or gasifiable silicon hydrides (silanes) such as $SiH_4$, $Si_2H_6$, $Si_3H_8$, or $Si_4H_{10}$, among which $SiH_4$ and $Si_2H_6$ are preferable in terms of ease to handle upon production of layer, high supply efficiency of Si, and so on.

In order to structurally introduce the hydrogen atoms into the photoconductive layer formed, to further facilitate control of the ratio of hydrogen atoms introduced, and to obtain the film characteristics for achieving the object of the present invention, it is necessary to form the layer by mixing a desired amount of $H_2$ or a gas of silicon compound containing hydrogen atoms with the gases described above.

Each gas may be a mixture of plural species at a predetermined mixture ratio without having to be limited to the single species.

Preferred examples effectively applicable as the raw-material gas for supply of halogen atoms used in the present invention include gas or gasifiable halogen compounds such as halogen gases, halides, interhalogen compounds containing halogen atoms, or halogen-substituted silane derivatives. In addition, further examples effectively applicable are gas or gasifiable, halogen-containing, silicon hydride compounds comprised of constituents of silicon atoms and halogen atoms. Specific examples of the halogen compounds preferably applicable in the present invention are fluorine gas ($F_2$) and the interhalogen compounds such as BrF, ClF, $ClF_3$, $BrF_3$, $BrF_5$, $IF_3$, and $IF_7$. Specific examples of the silicon compounds containing halogen atoms, i.e., the so-called, halogen-substituted silane derivatives, preferably applicable are silicon fluorides such as $SiF_4$ and $Si_2F_6$.

An amount of hydrogen atoms or/and halogen atoms contained in the photoconductive layer, may be controlled, for example, by controlling the temperature of substrate, an amount of the raw-material substance used for introduction of the hydrogen atoms and/or halogen atoms into the reaction vessel, the discharge power, or the like. In the present invention the photoconductive layer preferably contains the atoms for controlling the conductivity type as occasion may demand. The atoms for controlling the conductivity type may be contained in a uniformly distributed state all around in the photoconductive layer or may be contained in a nonuniformly distributed state in some portions in the direction of film thickness.

Specific examples of the atoms for controlling the conductivity type are so-called impurities in the semiconductor fields, more specifically, the atoms giving the p-type conduction characteristic and belonging to Group IIIb in the periodic table (hereinafter referred to as "IIIb-atoms") or the atoms giving the n-type conduction characteristic and belonging to Group Vb in the periodic table (hereinafter referred to as "Vb-atoms").

Specific examples of the IIIb-atoms are boron (B), aluminum (Al), gallium (Ga), indium (In), thallium (Tl), and so on and particularly, B, Al, and Ga are preferably applicable.

Specific examples of the Vb-atoms are phosphorus (P), arsenic (As), antimony (Sb), bismuth (Bi), and so on and particularly, P and As are preferably applicable.

A content of the atoms for controlling the conductivity type, contained in the photoconductive layer, is desirably determined to be preferably $1 \times 10^{-2}$ to $1 \times 10^4$ atomic ppm, more preferably $5 \times 10^{-2}$ to $5 \times 10^3$ atomic ppm, and most preferably $1 \times 10^{-1}$ to $1 \times 10^3$ atomic ppm.

For structurally introducing the atoms for controlling conductivity type, for example, the IIIb-atoms or the Vb-atoms into the photoconductive layer, the raw-material substance for introduction of the IIIb-atoms or the raw-material substance for introduction of the Vb-atoms may be introduced in a gas state together with another gas for making the photoconductive layer into the reaction vessel, upon formation of layer. The raw-material substance for introduction of the IIIb-atoms or the raw-material substance for introduction of the Vb-atoms is desirably selected from those existing in a gas state at ordinary temperature and under ordinary pressure and those that can be gasified readily at least under the conditions for forming the layer.

Specific examples of the raw-material substance for introduction of the IIIb-atoms are boron hydrides such as $B_2H_6$, $B_4H_{10}$, $B_5H_9$, $B_5H_{11}$, $B_6H_{10}$, $B_6H_{12}$, and $B_{10}H_{14}$ and boron halides such as $BF_3$, $BCl_3$, and $BBr_3$ for introduction of boron atoms. Other examples are $AlCl_3$, $GaCl_3$, $Ga(CH_3)_3$, $InCl_3$, $TlCl_3$, and so on.

Specific examples effectively applicable as the raw-material substance for introduction of the Vb-atoms are phosphorus hydrides such as $PH_3$ and $P_2H_4$ and phosphorus halides such as $PH_4I$, $PF_3$, $PF_5$, $PCl_3$, $PCl_5$, $PBr_3$, $PBr_5$, and $PI_3$ for introduction of phosphorus atom.

Other examples effectively applicable as a starting material for introduction of the Vb-atoms are $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$.

These raw-material substances for introduction of the atoms for controlling conductivity characteristic may be used as diluted with $H_2$ and/or He with necessity.

In the present invention the film thickness of the photoconductive layer is properly determined as desired in terms of achievement of the desired electrophotographic characteristics and the economical effect or the like and is desirably determined to be preferably 20 to 50 μm, more preferably 23 to 45 μm, and most preferably 25 to 40 μm.

For forming the photoconductive layer achieving the object of the present invention and having the desired film characteristics, it is necessary to properly set the mixture ratio of the gas for supply of Si and the diluent gas, the gas pressure inside the reaction vessel, the discharge power, and the temperature of the substrate.

The optimum range of flow rate of $H_2$ and/or He as the diluent gas is properly selected according to the design of layer, but a desired example is such that $H_2$ and/or He is controlled against the gas for supply of Si normally in the range of 3 to 20 times, preferably in the range of 4 to 15 times, and most preferably in the range of 5 to 10 times.

The optimum range of the discharge power is also properly selected according to the design of layer, but a desired example is such that the discharge power is set against the flow rate of the gas for supply of Si normally in the range of 0.5 to 7 W/sccm, preferably in the range of 1 to 6 W/sccm, and most preferably in the range of 1.5 to 5 W/sccm.

In the present invention, desired numerical ranges of the substrate temperature and the gas pressure for forming the photoconductive layer are those described above, but the conditions are not determined independently of each other in usual cases. Optimum values of the conditions are desirably determined based on mutual and organic relation so as to form the light receiving member having the desired characteristics.

In the case of the electrophotographic, photosensitive member suitably fabricated by the fabricating apparatus of the present invention, an a-Si-based surface layer is preferably formed further on the photoconductive layer.

This surface layer has a free surface and is provided for achieving the object of the present invention mainly in moisture-resistance, continuous and repetitive use characteristics, withstand voltage, operation environment characteristics, and durability. Since in the present invention each of amorphous materials respectively making the photoconductive layer and the surface layer constituting the light receiving layer has the common constituent of silicon atoms, chemical stability is fully assured at the interface between the stacked layers.

The surface layer can be made of any material selected from amorphous silicon based materials and preferred examples thereof are materials such as amorphous silicon containing hydrogen (H) and/or halogen (X) and further containing carbon (hereinafter referred to as "a-SiC:H, X"), amorphous silicon containing hydrogen (H) and/or halogen (X) and further containing oxygen (hereinafter referred to as "a-SiO:H, X"), amorphous silicon containing hydrogen (H) and/or halogen (X) and further containing nitrogen (hereinafter referred to as "a-SiN:H, X"), and amorphous silicon containing hydrogen (H) and/or halogen (X) and further containing at least one of carbon, oxygen, and nitrogen (hereinafter referred to as "a-SiCON:H, X").

The surface layer used in the present invention can be made of any amorphous material containing silicon, which is preferably a compound of silicon containing at least one element selected from carbon, nitrogen, and oxygen and which is particularly preferably one containing a-SiC as a main ingredient.

When the surface layer contains a-SiC as a main ingredient, a content of carbon is preferably in the range of 30% to 90% against the sum of silicon atoms and carbon atoms.

In the present invention the surface layer needs to contain hydrogen atoms and/or halogen atoms, which are necessary and indispensable for compensating for the dangling bonds of silicon atoms and for improving the quality of layer, particularly improving the photoconductive characteristics and charge holding characteristics. A content of hydrogen is desirably determined to be normally 30 to 70 atomic %, preferably 35 to 65 atomic %, and most preferably 40 to 60 atomic % with respect to the total amount of constituent atoms. A content of fluorine atoms is desirably determined to be normally 0.01 to 15 atomic %, preferably 0.1 to 10 atomic %, and most preferably 0.6 to 4 atomic %.

Effectively applicable substances as the gas for supply of silicon (Si) used in the formation of the surface layer of the present invention include gas or gasifiable silicon hydrides (silanes) such as $SiH_4$, $Si_2H_6$, $Si_3H_8$, or $Si_4H_{10}$, among which $SiH_4$ and $Si_2H_6$ are preferable in terms of ease to handle upon production of layer, high supply efficiency of Si, and so on.

These raw-material gases for supply of Si may be used as diluted with a gas such as $H_2$, He, Ar, or Ne with necessity.

Substances effectively applicable as the gas for supply of carbon are gas or gasifiable hydrocarbons such as $CH_4$, $C_2H_6$, $C_3H_8$, and $C_4H_{10}$ and particularly preferred substances are $CH_4$ and $C_2H_6$ in terms of ease to handle upon production of the layer, high supply efficiency of C, and so on.

These raw-material gases for supply of C may be used as diluted with a gas such as $H_2$, He, Ar, or Ne with necessity.

Substances effectively applicable as the gas for supply of nitrogen or oxygen are gas or gasifiable compounds such as $NH_3$, NO, $N_2O$, $NO_2$, $O_2$, CO, $CO_2$, and $N_2$. These raw-material gases for supply of nitrogen or oxygen may be used as diluted with a gas such as $H_2$, He, Ar, or Ne with necessity.

For further facilitating control of introduction ratio of hydrogen atoms introduced into the surface layer to be formed, it is preferred to form the layer by mixing these gases further with a desired amount of hydrogen gas or a gas of silicon compound containing hydrogen atoms.

Each gas may be a mixture of plural species at a predetermined mixture ratio without having to be limited to the single species.

Preferred examples effectively applicable as the raw-material gas for supply of halogen atoms include gas or gasifiable halogen compounds such as halogen gases, halides, interhalogen compounds containing halogen atoms, or halogen-substituted silane derivatives. In addition, further examples effectively applicable are gas or gasifiable, halogen-containing, silicon hydride compounds comprised of constituents of silicon atoms and halogen atoms.

Specific examples of the halogen compounds preferably applicable in the present invention are fluorine gas ($F_2$) and the interhalogen compounds such as BrF, ClF, $ClF_3$, $BrF_3$, $BrF_5$, $IF_3$, and $IF_7$.

Specific examples of the silicon compounds containing halogen atoms, i.e., the so-called, halogen-substituted silane derivatives, preferably applicable are silicon fluorides such as $SiF_4$ and $Si_2F_6$.

An amount of hydrogen atoms and/or halogen atoms contained in the surface layer, may be controlled, for example, by controlling the temperature of substrate, an amount of the raw-material substance used for introduction of the hydrogen atoms and/or halogen atoms into the reaction vessel, the discharge power, or the like. The carbon atoms and/or the oxygen atoms and/or the nitrogen atoms may be contained in a uniformly distributed state all around in the surface layer or may be contained in a nonuniformly distributed state in some portions in the direction of film thickness of the surface layer.

The thickness of the surface layer in the present invention is desirably determined to be normally 0.01 to 3 μm, preferably 0.05 to 2 μm, and most preferably 0.1 to 1 μm. If the thickness is smaller than 0.01 μm, the surface layer will be lost because of abrasion or the like during use of the light receiving member. If the thickness is over 3 μm, degradation of the electrophotographic characteristics, such as an increase in residual potential, will result.

The electrophotographic, photosensitive member fabricated by the apparatus of the present invention can be used not only in the electrophotographic copiers, but also widely in the electrophotographic application fields of laser beam printers, CRT printers, LED printers, liquid crystal printers, laser plate makers, and so on.

EXAMPLES

Examples of the present invention will be described, but it is noted that the present invention is by no means intended to be limited to these examples.

Example 1

In the deposit film forming apparatus shown in FIG. 1, the a-Si film was formed on a cylindrical substrate of aluminum under the fabrication conditions of Table 1 and with the high-frequency power supply of 105 MHz, thereby producing the photosensitive member for electrophotography.

After completion of the production, the electrophotographic, photosensitive member was taken out and instead thereof, a dummy cylindrical substrate was set. Then dry etching was carried out under the conditions of Table 2.

The high-frequency power supply at this time was one having the RF frequency of oscillation frequency 13.56 MHz.

The pressure in the discharge space was 0.4 Torr. Adjustment of pressure was made by bypassing the diffusion pump by a bypass pipe and directly evacuating the space by the mechanical booster pump and the rotary pump.

Completion of the etching was detected by an increase in the internal pressure and an increase in the temperature of the substrate. After completion of the etching, the deposition chamber was observed to check presence or absence of residual film in the furnace.

In the present example, presence or absence of residual film in the furnace was evaluated by four classifications below.

⊚: Nothing remains at all.

○: White powder remains a little, but it is practically permissible.

Δ: The deposit film remains at some portions.

×: The deposit film remains considerable and could raise a problem in practical use in some cases.

TABLE 1

| Fabrication conditions of photosensitive member for electrophotography | |
|---|---|
| Lower preventing layer | $SiH_4$ 300 sccm |
| | $H_2$ 400 sccm |
| | NO 8 sccm |
| | $B_2H_6$ 2000 ppm |
| | power 400 W |
| | internal pressure |
| | 20 mTorr |
| | film thickness 1 μm |
| Photoconductive layer | $SiH_4$ 500 sccm |
| | $H_2$ 400 sccm |
| | power 600 W |
| | internal pressure |
| | 30 mTorr |
| | film thickness 20 μm |
| Surface protecting layer | $SiH_4$ 50 sccm |
| | $CH_4$ 500 sccm |
| | power 100 W |
| | internal pressure |
| | 30 mTorr |
| | film thickness 0.5 μm |

TABLE 2

Dry etching conditions

| | |
|---|---|
| $CF_4$ | 500 sccm |
| $O_2$ | 100 sccm |
| power | 1000 W |
| internal pressure | 0.4 Torr or 15 mTorr |

Comparative Example 1

In the deposit film forming apparatus shown in FIG. 1, the a-Si film was formed on a cylindrical substrate of aluminum under the fabrication conditions of Table 1 and with the high-frequency power supply of 105 MHz, thereby producing the photosensitive member for electrophotography. After completion of the production, the electrophotographic, photosensitive member was taken out and instead thereof, a dummy cylindrical substrate was set. Then dry etching was carried out under the conditions of Table 2.

The high-frequency power supply at this time was one having the VHF frequency of oscillation frequency 105 MHz.

For setting the internal pressure to 15 mTorr, evacuation was carried out by the diffusion pump, mechanical booster pump, and rotary pump in the same manner as upon the film formation.

Completion of the etching was detected by the increase in the internal pressure and the increase in the temperature of the substrate. After completion of the etching, the deposition chamber was observed to check presence or absence of residual film in the furnace.

The method of evaluation was the same as in Example 1.

Comparative Example 2

In the deposit film forming apparatus shown in FIG. 1, the a-Si film was formed on a cylindrical substrate of aluminum under the fabrication conditions of Table 1 and with the high-frequency power supply of 105 MHz, thereby producing the photosensitive member for electrophotography.

After completion of the production, the electrophotographic, photosensitive member was taken out and instead thereof, a dummy cylindrical substrate was set. Then dry etching was carried out under the conditions of Table 2.

The high-frequency power supply at this time was one having the VHF frequency of oscillation frequency 105 MHz, and in order to set the internal pressure to 0.4 Torr as in Example 1, evacuation was carried out by bypassing the diffusion pump by the bypass pipe and directly evacuating the space by the mechanical booster pump and rotary pump.

Completion of the etching was detected by the increase in the internal pressure and the increase in the temperature of the substrate. After completion of the etching, the deposition chamber was observed to check presence or absence of residual film in the furnace. The method of evaluation was the same as in Example 1.

The results of Example 1 and Comparative Examples 1 and 2 are shown in Table 3.

When cleaning was conducted in the RF frequency band according to the method of the present invention, no film remained at all, so that the result was very good. However, in the case of Comparative Example 1 in which dry etching was conducted using the VHF frequency band and in the high vacuum state, the film remained at some portions and it seems that a problem will arise after repetition of the cycle of film formation and etching. Further, in the case wherein the VHF frequency band was used and the internal pressure was increased without using the diffusion pump, discharge unevenness became further extreme and a considerable film remained even after the end of etching. It is considered that this amount of remaining film will produce dust in carrying out the film formation several times and will raise a problem in respect of image defects with high possibility.

TABLE 3

| | Level of residual film |
|---|---|
| Example 1 | ⊚ |
| Comparative Example 1 | Δ |
| Comparative Example 2 | x |

Example 2

In the deposit film forming apparatus shown in FIG. 1, the a-Si film was formed on a cylindrical substrate of aluminum under the fabrication conditions of Table 1 and with the high-frequency power supply of 50 MHz, thereby producing the photosensitive member for electrophotography.

After completion of the production, the electrophotographic, photosensitive member was taken out and instead thereof, a dummy cylindrical substrate was set. Then dry etching was carried out under the conditions of Table 4. The high-frequency power supply at this time was one having the RF frequency of oscillation frequency 13.56 MHz.

The pressure in the discharge space was 0.5 Torr. Adjustment of pressure was made by bypassing the diffusion pump by the bypass pipe and directly evacuating the space by the mechanical booster pump and the rotary pump.

Completion of the etching was detected by the increase in the internal pressure and the increase in the temperature of the substrate, and the time up to the completion of etching was measured in the present example.

Comparative Example 3

In the deposit film forming apparatus shown in FIG. 1, the a-Si film was formed on a cylindrical substrate of aluminum under the fabrication conditions of Table 1 and with the high-frequency power supply of 50 MHz, thereby producing the photosensitive member for electrophotography.

After completion of the production, the electrophotographic, photosensitive member was taken out and instead thereof, a dummy cylindrical substrate was set. Then dry etching was carried out under the conditions of Table 4.

The high-frequency power supply at this time was one having the VHF frequency of oscillation frequency 50 MHz.

For setting the internal pressure to 20 mTorr, evacuation was carried out by the diffusion pump, mechanical booster pump, and rotary pump in the same manner as upon the film formation.

Completion of the etching was determined in such a manner that etching was carried out for a time approximately 1.5 times the time detected by the increase in the internal pressure and the increase in the temperature of the substrate, deposition states of film were checked by sometimes stopping discharge and returning the chamber to the atmosphere, and the time before perfect cleaning was measured thereby.

TABLE 4

| Dry etching conditions | |
| --- | --- |
| $CF_2H_2$ | 600 sccm |
| power | 1500 W |
| internal pressure | 0.5 Torr or 20 mTorr |

Comparative Example 4

In the deposit film forming apparatus shown in FIG. 1, the a-Si film was formed on a cylindrical substrate of aluminum under the fabrication conditions of Table 1 and with the high-frequency power supply of 50 MHz, thereby producing the photosensitive member for electrophotography.

After completion of the production, the electrophotographic, photosensitive member was taken out and instead thereof, a dummy cylindrical substrate was set. Then dry etching was carried out under the conditions of Table 4.

The high-frequency power supply at this time was one having the VHF frequency of oscillation frequency 50 MHz, and in order to set the internal pressure to 0.5 Torr as in Example 2, evacuation was carried out by bypassing the diffusion pump by the bypass pipe and directly evacuating the space by the mechanical booster pump and rotary pump.

Completion of the etching was determined in such a manner that etching was carried out for the time approximately 1.5 times the time detected by the increase in the internal pressure and the increase in the temperature of the substrate, deposition states of film were checked by sometimes stopping discharge and returning the furnace to the atmosphere, and the time before perfect cleaning was measured thereby.

The results of Example 2 and Comparative Examples 3 and 4 are shown in Table 5.

Since the deposit film was uniformly etched in the deposition chamber by the method of cleaning according to the present invention, the etching was ended within a very short time.

However, when etching was done in the VHF band of Comparative Example 3, there were portions with slow etch rates because of unevenness of discharge, so that the etch time was approximately doubled as restricted by such portions. Further, in the case wherein the high-frequency power in the VHF band was used and the pressure in the discharge space was as high as 0.5 Torr as in Comparative Example 4, the distribution of plasma became further extreme and regions where little etching proceeded appeared in the deposition chamber. Thus, no sign of complete etching was observed even after continuation of etching for 10 hours, and the experiment was stopped.

TABLE 5

| | Etch time |
| --- | --- |
| Example 2 | 3.5 Hr |
| Comparative Example 3 | 7.0 Hr |
| Comparative Example 4 | 10 Hr-etching did not result in perfect removal of film, and etching was thus stopped. |

Example 3

Running tests of fabrication of the electrophotographic, photosensitive member were conducted using the deposit film forming apparatus shown in FIG. 1. The sequence of producing the photosensitive member for electrophotography on the cylindrical substrate of aluminum under the fabrication conditions of Table 6 and then carrying out the dry etching according to Table 7 was repetitively conducted by 20 cycles. In the present example the high-frequency power supply was of 80 MHz in fabricating the electrophotographic, photosensitive member.

In carrying out the dry etching the power supply was of 10 MHz and the internal pressure was the condition of 0.7 Torr.

The electrophotographic, photosensitive members thus fabricated in Example 3 were evaluated by the following method.

Each photosensitive member was set in an electrophotographic apparatus (which was a modified model for experiment of NP6060 available from CANON INC.) and the electrophotographic characteristics including the initial electrifiability, residual potential, etc. were evaluated as follows.

Electrifiability: The light receiving member for electrophotography was installed in the experimental apparatus, the high voltage of +6 kV was applied to the charging device to cause corona charge, and a dark surface potential of the light receiving member for electrophotography was measured by a surface electrometer.

Sensitivity: The electrophotographic, photosensitive member was charged at a fixed dark surface potential. Immediately after it, the photosensitive member was exposed to light obtained by removing light in the wavelength region of 600 nm and more from light from a halogen lamp with a filter, and the quantity of light was adjusted so that the light-exposed surface potential of the electrophotographic, photosensitive member was a predetermined value. The quantity of light necessary at this time was calculated from on-voltage of the halogen lamp light source.

Residual potential: The light receiving member for electrophotography was charged at a fixed dark surface potential. Immediately after it, the surface was exposed to relatively strong light of constant quantity of light. The light source was the halogen lamp light source and the light used for exposure was the one obtained by removing the light in the wavelength region of 600 nm and more with a filter. At this time the light-exposed surface potential of the light receiving member for electrophotography was measured by the surface electrometer.

White dots: Copy was conducted with a totally black chart available from CANON INC. (part number: FY9-9073) being placed on an original platen and a copy image obtained thereby was evaluated as to white dots of diameters of 0.2 mm and more in the same area thereof.

Evaluation classifications were as follows.

Each photosensitive member was evaluated using the following classifications.

⊚: very good

○: good

Δ: conventional level and no problem in practical use (acceptable though dots existed)

×: not acceptable for practical use (there were many dots)

TABLE 6

Fabrication conditions of photosensitive member for electrophotography

| Lower preventing layer | SiH$_4$ 150 sccm |
| --- | --- |
| | H$_2$ 300 sccm |
| | NO 5 sccm |
| | B$_2$H$_6$ 1000 ppm |
| | power 300 W |
| | internal pressure 20 mTorr |
| | film thickness 2 μm |
| Photoconductive layer | SiH$_4$ 500 sccm |
| | H$_2$ 500 sccm |
| | power 600 W |
| | internal pressure 15 mTorr |
| | film thickness 20 μm |
| Surface protecting layer | SiH$_4$ 10 sccm |
| | CH$_4$ 500 sccm |
| | power 800 W |
| | internal pressure 15 mTorr |
| | film thickness 0.5 μm |

TABLE 7

Dry etching conditions

| ClF$_3$ | 600 sccm |
| --- | --- |
| Ar | 600 sccm |
| power | 1000 W |
| internal pressure | 0.7 Torr (in the case of 20 MHz or less) |
| internal pressure | 10 mTorr (in the case of 50 MHz to 450 MHz) |

Comparative Example 5

Running tests of fabrication of the electrophotographic, photosensitive member were conducted using the deposit film forming apparatus shown in FIG. 1.

The sequence of producing the photosensitive member for electrophotography on the cylindrical substrate of aluminum under the fabrication conditions of Table 6 and then carrying out the dry etching according to Table 7 was repetitively conducted by 20 cycles.

In the present comparative example the high-frequency power supply was of 80 MHz in fabricating the electrophotographic, photosensitive member. In carrying out the dry etching the power supply was also of 80 MHz and the internal pressure was the condition of 10 mTorr. Completion of the dry etching was detected by the increase in the internal pressure and the increase in the temperature of the substrate.

The electrophotographic, photosensitive members produced in Comparative Example 5 were also evaluated by the same method as in Example 3.

The results of Example 3 and Comparative Example 5 are shown in Table 8. It was clearly confirmed that the method for fabricating the electrophotographic, photosensitive member according to the present invention was an excellent method that can fabricate the electrophotographic, photosensitive members with very stable and good characteristics the image level of which was not degraded even with repetition of the film formation and etching cycle, as compared with the conventional photosensitive members shown in Comparative Example 5.

TABLE 8

| | | electrifiability | sensitivity | residual potential | white dots |
| --- | --- | --- | --- | --- | --- |
| Example 3 | after 1 cycle | ◎ | ◎ | ◎ | ◎ |
| | after 5 cycles | ◎ | ◎ | ◎ | ◎ |
| | after 10 cycles | ◎ | ◎ | ◎ | ◎ |
| | after 15 cycles | ◎ | ◎ | ◎ | ◎ |
| | after 20 cycles | ◎ | ◎ | ◎ | ◎ |
| Comparative Example 5 | after 1 cycle | ◎ | ◎ | ◎ | ◎ |
| | after 5 cycles | ◎ | ◎ | ◎ | ○ |
| | after 10 cycles | ◎ | ◎ | ◎ | Δ |
| | after 15 cycles | ◎ | ◎ | ◎ | x |
| | after 20 cycles | ◎ | ◎ | ◎ | x |

Example 4

Oil was extracted from the diffusion pump used as an evacuation device of the deposition apparatus shown in FIG. 1 and used in Example 3 and was observed in detail. It was compared as to color, viscosity, and the like with new oil, and it was confirmed that the oil of the diffusion pump after the end of 20 cycles of film formation was not modified at all and it kept a transparent and smooth state equivalent to the new oil.

Comparative Example 6

Oil was extracted from the diffusion pump used as an evacuation device in the deposition apparatus shown in FIG. 1 and used in Comparative Example 5 and was observed in detail. It was compared as to color, viscosity, and the like with new oil and it was found that the oil of the diffusion pump after the end of 20 cycles of film formation was darkened and it became more viscous because of promotion of oxidation. The degree of deterioration of the oil was of an extent that the oil must be changed after use of additional several 10 cycles.

Example 5

In the deposition film forming apparatus capable of fabricating six electrophotographic, photosensitive members at one time as shown in FIG. 5, the a-Si film was formed on each cylindrical substrate of aluminum under the fabrication conditions of Table 1 and with the high-frequency power supply of 150 MHz, thus producing the photosensitive members for electrophotography. After completion of the production, the electrophotographic, photosensitive members were taken out and dummy cylindrical substrates were set instead thereof. Then the dry etching was carried out under the conditions of Table 9. The high-frequency power supply at this time was one having the RF frequency of oscillation frequency 15 MHz. The pressure in the discharge space was 0.35 Torr. The pressure was adjusted by bypassing the diffusion pump by the bypass pipe and directly evacuating the space by the mechanical booster pump and rotary pump. Completion of the etching was detected by detecting the increase in the internal pressure and the increase in the temperature of substrate.

In the present example this sequence was repeated by 20 cycles and the quality of electrophotographic, photosensitive member was then checked. The results demonstrated that very good conditions were maintained as to all electrifiability, sensitivity, residual potential, and image defects.

Etching was completed in three hours and no degradation was observed of the oil in the diffusion pump, as expected.

TABLE 9

| Dry etching conditions | |
|---|---|
| $CF_2H_2$ | 400 sccm |
| $H_2$ | 100 sccm |
| power | 1500 W |
| internal pressure | 0.35 Torr |

According to the present invention, as described above, film formation is carried out by decomposing the raw-material gas containing at least silicon atoms by the high-frequency power in the VHF band and cleaning is carried out by using the gas containing at least fluorine atoms and by etching and removing the deposit film deposited in the deposition chamber using the high-frequency power of the frequency lower than the frequency used for the foregoing decomposition, preferably of the frequency lower than the VHF band, whereby the cleaning time of deposition chamber can be decreased remarkably, whereby the deposit film can be formed with high quality and with uniformity, whereby fabrication thereof can be done in short time and at low cost, and whereby stable and efficient fabrication can be achieved of the deposit film that can be suitably applicable to a high-quality electrophotographic, photosensitive member with excellent reproducibility, with high electrifiability, and especially with less defects of image.

What is claimed is:

1. A plasma process method comprising introducing a raw-material gas into a deposition chamber while evacuating the inside of the deposition chamber capable of being kept airtight in a vacuum while evacuating the inside of the deposition chamber, performing decomposition of the raw-material gas by high-frequency power in a VHF band, performing film formation of a deposit film on a substrate installed in the deposition chamber, and thereafter cleaning the inside of the deposition chamber, wherein said film formation is carried out by evacuating the inside of the deposition chamber by use of a diffusion pump or turbo molecular pump, introducing a raw-material gas containing silicon atoms into the deposition chamber, decomposing the raw-material gas using the high-frequency power in the range of 50 MHz to 450 MHz inclusive, and wherein said cleaning is carried out by evacuating the inside of the deposition chamber without use of a diffusion pump or turbo molecular pump, introducing into the deposition chamber at least one gas containing fluorine atoms selected from the group consisting of $CF_4$, $CF_mH_n$ (m+n=4), $ClF_3$, and $C_2F_6$, and decomposing the at least one gas containing fluorine atoms using a high-frequency power of a frequency of 1 MHz to 20 MHz inclusive, thereby etching and removing a deposit film adhering to the inside of the deposition chamber.

2. The plasma process method according to claim 1, wherein a gas selected from the group consisting of $O_2$, $H_2$, Ar, and $N_2$ is further supplied in said cleaning.

3. The plasma process method according to claim 1, wherein internal pressure of the deposition chamber upon said film formation is in the range of 0.1 mTorr to 100 mTorr and internal pressure of the deposition chamber upon said cleaning is in the range of 0.1 Torr to 10 Torr.

4. The plasma process method according to claim 1, wherein the internal pressure of the deposition chamber during said cleaning is higher than the internal pressure of the deposition chamber during said film formation.

* * * * *